(12) United States Patent
Milojevic et al.

(10) Patent No.: US 11,081,364 B2
(45) Date of Patent: Aug. 3, 2021

(54) REDUCTION OF CRYSTAL GROWTH RESULTING FROM ANNEALING A CONDUCTIVE MATERIAL

(71) Applicant: Micron Technology, Inc., Boise, ID (US)

(72) Inventors: Marko Milojevic, Boise, ID (US); John A. Smythe, III, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/269,309

(22) Filed: Feb. 6, 2019

(65) Prior Publication Data

US 2020/0251349 A1  Aug. 6, 2020

(51) Int. Cl.
| | |
|---|---|
| *H01L 27/10* | (2006.01) |
| *H01L 21/321* | (2006.01) |
| *H01L 21/3205* | (2006.01) |
| *H01L 21/768* | (2006.01) |
| *H01L 27/108* | (2006.01) |
| *H01L 49/02* | (2006.01) |

(52) U.S. Cl.
CPC ...... *H01L 21/321* (2013.01); *H01L 21/32051* (2013.01); *H01L 21/76886* (2013.01); *H01L 27/10829* (2013.01); *H01L 28/65* (2013.01)

(58) Field of Classification Search
CPC ............ H01L 21/321; H01L 21/32051; H01L 21/76886; H01L 27/10829
USPC ................................................. 257/401, 734
See application file for complete search history.

(56) References Cited

U.S. PATENT DOCUMENTS

| | | | |
|---|---|---|---|
| 4,270,136 A * | 5/1981 | Toyokura | H01L 21/28167 257/383 |
| 4,604,791 A | 8/1986 | Todorof | |
| 6,239,451 B1 | 5/2001 | Fonash et al. | |
| 6,949,444 B2 * | 9/2005 | Torres | H01L 21/32051 257/E21.295 |
| 6,974,991 B2 * | 12/2005 | Cheng | H01L 27/1087 257/301 |
| 7,662,693 B2 | 2/2010 | Bhattacharyya | |
| 7,875,529 B2 | 1/2011 | Forbes et al. | |
| 8,274,777 B2 | 9/2012 | Kiehlbauch | |
| 2002/0058408 A1 * | 5/2002 | Maydan | H01L 21/76885 438/637 |
| 2003/0173671 A1 * | 9/2003 | Hironaga | H01L 21/02074 257/758 |
| 2003/0194858 A1 * | 10/2003 | Lee | H01L 21/76846 438/643 |
| 2004/0013803 A1 * | 1/2004 | Chung | C23C 16/34 427/255.391 |

(Continued)

*Primary Examiner* — Sheikh Maruf
(74) *Attorney, Agent, or Firm* — Brooks, Cameron & Huebsch, PLLC

(57) ABSTRACT

Systems, apparatuses, and methods related to reduction of crystal growth resulting from annealing a conductive material are described. An example apparatus includes a conductive material selected to have an electrical resistance that is reduced as a result of annealing. A stabilizing material may be formed over a surface of the conductive material. The stabilizing material may be selected to have properties that include stabilization of the reduced electrical resistance of the conductive material and reduction of a degree of freedom of crystal growth relative to the surface resulting from recrystallization of the conductive material during the annealing.

5 Claims, 6 Drawing Sheets

(56) References Cited

U.S. PATENT DOCUMENTS

| | | | |
|---|---|---|---|
| 2004/0022960 A1* | 2/2004 | Rhee | C23C 16/402 427/563 |
| 2004/0053491 A1* | 3/2004 | Park | H01L 21/76843 438/637 |
| 2004/0169274 A1* | 9/2004 | Matsumoto | H01L 23/53223 257/734 |
| 2005/0009325 A1* | 1/2005 | Chung | C23C 16/14 438/637 |
| 2005/0029665 A1* | 2/2005 | Lin | H01L 21/76877 257/762 |
| 2005/0277264 A1* | 12/2005 | Cheng | H01L 29/945 438/433 |
| 2006/0108689 A1* | 5/2006 | Kim | H01L 21/32051 257/758 |
| 2006/0148247 A1* | 7/2006 | Liu | H01L 21/316 438/643 |
| 2008/0258301 A1* | 10/2008 | Amatatsu | H01L 21/76886 257/750 |
| 2010/0264398 A1* | 10/2010 | Gardner | C23C 16/30 257/4 |
| 2012/0205793 A1* | 8/2012 | Schieffer | H01L 21/76864 257/734 |
| 2013/0203266 A1* | 8/2013 | Hintze | H01L 21/76861 438/763 |
| 2014/0054660 A1* | 2/2014 | Suguro | H01L 21/321 257/288 |
| 2014/0191389 A1* | 7/2014 | Lee | H01L 21/32051 257/734 |
| 2015/0228496 A1* | 8/2015 | Nakano | C23C 14/5806 438/785 |
| 2016/0056053 A1* | 2/2016 | Thombare | C23C 16/45542 438/664 |
| 2016/0133470 A1* | 5/2016 | Bordelon | H01L 29/4966 438/589 |
| 2016/0293556 A1* | 10/2016 | Uzoh | H01L 24/06 |
| 2017/0287942 A1 | 10/2017 | Wang et al. | |
| 2018/0090516 A1 | 3/2018 | Wang et al. | |
| 2018/0197938 A1* | 7/2018 | Edelstein | H01L 21/7684 |
| 2018/0197940 A1* | 7/2018 | Edelstein | H01L 21/76802 |
| 2019/0109009 A1* | 4/2019 | Longrie | H01L 21/30655 |
| 2019/0203054 A1* | 7/2019 | Seki | C09D 5/00 |

\* cited by examiner

```
                                 340 ──▶

┌─────────────────────────────────────────────────────────────────┐
    │      FORMING A STABILIZING MATERIAL ON AN EXPOSED SURFACE       │── 342
    │              OF A CONDUCTIVE MATERIAL                           │
    └─────────────────────────────────────────────────────────────────┘
                                    │
    ┌─────────────────────────────────────────────────────────────────┐
    │  ANNEALING THE CONDUCTIVE MATERIAL AND THE STABILIZING MATERIAL │── 344
    │   TO REDUCE AN ELECTRICAL RESISTANCE OF THE CONDUCTIVE MATERIAL │
    └─────────────────────────────────────────────────────────────────┘
                                    │
    ┌─────────────────────────────────────────────────────────────────┐
    │     REDUCING CRYSTAL GROWTH OF THE CONDUCTIVE MATERIAL TOWARD   │
    │  THE STABILIZING MATERIAL, RESULTING FROM PRESENCE OF THE FORMED│── 346
    │   STABILIZING MATERIAL DURING THE ANNEALING, TO REDUCE A ROUGHNESS│
    │   ON THE FORMERLY EXPOSED SURFACE OF THE CONDUCTIVE MATERIAL    │
    └─────────────────────────────────────────────────────────────────┘
```

┌─────────────────────────────────────────────────────────────────┐
    │     DEPOSITING A NOBLE METAL AS A CONDUCTIVE MATERIAL           │── 451
    │            ON A SURFACE OF A SUBSTRATE MATERIAL                 │
    └─────────────────────────────────────────────────────────────────┘
                                    │
    ┌─────────────────────────────────────────────────────────────────┐
    │  DEPOSITING A NITRIDE OF A REFRACTORY METAL AS A STABILIZING    │── 453
    │     MATERIAL ON AN EXPOSED SURFACE OF THE NOBLE METAL           │
    └─────────────────────────────────────────────────────────────────┘
                                    │
    ┌─────────────────────────────────────────────────────────────────┐
    │  ANNEALING THE NOBLE METAL AND THE NITRIDE OF THE REFRACTORY METAL│── 455
    │       TO REDUCE AN ELECTRICAL RESISTANCE OF THE NOBLE METAL     │
    └─────────────────────────────────────────────────────────────────┘
                                    │
    ┌─────────────────────────────────────────────────────────────────┐
    │   REDUCING CRYSTAL GROWTH OF THE NOBLE METAL ABOVE A LEVEL      │
    │       OF THE FORMERLY EXPOSED SURFACE OF THE NOBLE METAL,       │── 457
    │        RESULTING FROM PRESENCE OF THE FORMED NITRIDE OF THE     │
    │ REFRACTORY METAL DURING THE ANNEALING, TO REDUCE A ROUGHNESS ON:│
    └─────────────────────────────────────────────────────────────────┘
                                    │
    ┌─────────────────────────────────────────────────────────────────┐
    │      THE FORMERLY EXPOSED SURFACE OF THE NOBLE METAL AND        │── 459
    │     AN EXPOSED SURFACE OF THE NITRIDE OF THE REFRACTORY METAL   │
    └─────────────────────────────────────────────────────────────────┘
```

*Fig. 4*

REDUCTION OF CRYSTAL GROWTH RESULTING FROM ANNEALING A CONDUCTIVE MATERIAL

TECHNICAL FIELD

The present disclosure relates generally to semiconductor devices and methods, and more particularly to reduction of crystal growth resulting from annealing a conductive material.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. Various volatile memory cells, such as DRAM cells may be operated (e.g., programmed, read, erased, etc.) faster than various non-volatile memory cells, such as flash memory cells. Conditions that affect conduct of electricity and electronic signals via conductive pathways also may affect operation of the various types of memory and electronic devices.

BRIEF DESCRIPTION OF THE DRAWINGS

FIG. 3 is a flow diagram of an example method for reduction of crystal growth resulting from annealing a conductive material in accordance with a number of embodiments of the present disclosure.

FIG. 4 is a flow diagram of another example method for reduction of crystal growth resulting from annealing a conductive material in accordance with a number of embodiments of the present disclosure.

DETAILED DESCRIPTION

Figure 1:
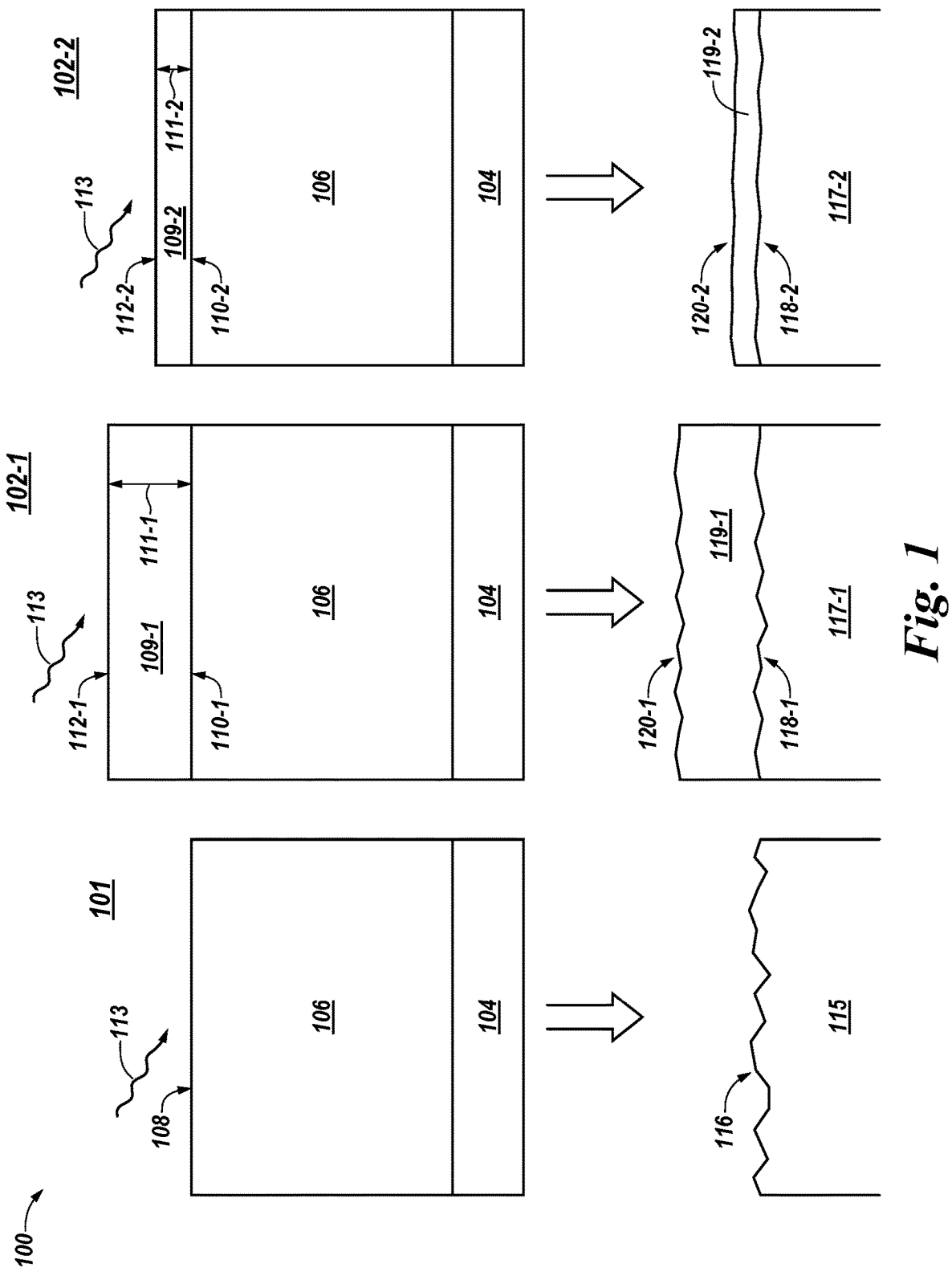
FIG. 1 shows a cross-sectional view of portions of example structural configurations including conductive material to illustrate results of crystal growth on the conductive material in examples of fabrication in accordance with a number of embodiments of the present disclosure.

Various types of memory and electronic devices may have conductive pathways to enable access to and control of various components. The conductive pathways may include electrodes, access lines (e.g., word lines), and sense lines (e.g., bit lines), among other possible conductive pathways, to conduct electricity and/or electronic signals, such as instructions and/or data. The components accessible via the conductive pathways may include control circuitry, sense amplifiers, memory cells, transistors, and capacitors, among other possible components. The various types of memory and electronic devices may have a conductive material formed as part of (e.g., within) the conductive pathway.

Annealing a conductive material (e.g., an element selected from the "noble metals" in the periodic table) may improve electrical conductivity of the conductive material by reducing its electrical resistivity (resistance) relative to that of the conductive material prior to being annealed. The anneal process may occur by a sufficiently increased temperature (energy) causing linkages between atoms of the conductive material to break. This may result in an increased rate of diffusion of atoms in the conductive material such that the atoms migrate in a crystal lattice and dislocations may decrease to progressively bring the conductive material toward an equilibrium state. Subsequent cooling may result in recrystallization of the conductive material. The recrystallization of the conductive material (e.g., the selected noble metal) during the anneal process may result in reduction of the resistance of the conductive material. The recrystallization may result in agglomeration of larger grains (crystals) with an increased number and/or size of grain boundaries that reduce the resistance of the conductive material. The recrystallization also may result in crystal growth in three dimensions (3D) in the conductive material. Crystal growth in a first dimension relative to (e.g., toward) an exposed surface of the conductive material during the anneal process may increase roughness on the exposed surface of the conductive material.

Such a conductive material may be formed from one or more of the noble metals. The noble metals may be resistant to corrosion and oxidation relative to other metals, along with being electrically conductive. The noble metals may be selected from ruthenium (Ru), rhodium (Rh), palladium (Pd), silver (Ag), osmium (Os), iridium (Ir), platinum (Pt), and/or gold (Au).

The increased surface roughness resulting from annealing such conductive metals may have unintended consequences. Such unintended consequences may, at least in part, result from one or more portions of the exposed surface of the conductive material being roughened by the crystal growth such that these portions extend above a previously comparatively level surface of the conductive material. As described further herein, the previously comparatively level surface may, for example, be on an exposed surface of a film (e.g., layer) of a selected noble metal. The selected noble metal may be formed (e.g., deposited) to have a thickness in a range of from around 2.0 nanometers (nm) to around 50 nm. The film of the selected noble metal formed to a thickness in the 2-50 nm range may be termed a "thin film" in semiconductor fabrication.

The increased surface roughness may cause an increased capacitance (e.g., due to an increased volume and/or surface area) of such conductive materials. The increased capacitance may cause an increased probability for capacitive coupling between structural components that include such conductive materials, and/or extension of the surface roughness into an area or space intended to be occupied by other structural components (e.g., critical dimensions (CDs) of a final structure or intermediary structures of a memory device), among other possible unintended consequences. Hence, it would be advantageous to reduce a degree of freedom of crystal growth relative to the first dimension (in the direction of the exposed surface) of the conductive material, while retaining the crystal growth in the other two dimensions during the anneal process. As such, the resistance of the conductive material may be reduced while also reducing a probability of surface roughness interfering with formation of the other structural components adjacent the conductive material. These benefits may be particularly advantageous with regard to conductive pathways having structural components with CDs of around 20 nm or less that include the conductive material processed as described herein.

Accordingly, the present disclosure includes systems, apparatuses, and methods related to reduction of crystal growth resulting from annealing a conductive material. An example apparatus includes a conductive material selected to have an electrical resistance that is reduced as a result of annealing. A stabilizing material may be formed over (e.g., on) a surface of the conductive material. The stabilizing material may be selected to have properties that include stabilization of the reduced electrical resistance of the conductive material and reduction of a degree of freedom of crystal growth relative to the surface resulting from recrystallization of the conductive material during the annealing.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the figure number of the drawing and the remaining digits identify an element or component in the drawing. Similar elements or components between different figures may be identified by the use of similar digits. For example, 117 may reference element "17" in FIG. 1, and a similar element may be referenced as 217 in FIG. 2. In some instances, a plurality of similar, but functionally and/or structurally distinguishable, elements or components in the same figure or in different figures may be referenced sequentially with the same element number (e.g., 109-1 and 109-2 in FIG. 1). Moreover, an element number used by itself is intended to be inclusive of more specific embodiments that include that element number. For example, element number 219 in FIG. 2 may be element numbers 119-1 and 119-2 in FIG. 1.

FIG. 1 shows a cross-sectional view of portions of example structural configurations 100 including conductive material to illustrate results of crystal growth on the conductive material resulting from annealing in examples of fabrication in accordance with a number of embodiments of the present disclosure. The reduction of crystal growth on the conductive material may be utilized in various fabrication processes. Such fabrication processes may, for example, be utilized in fabrication of electrodes, access lines, and/or sense lines, among other possible conductive pathways, associated with example memory devices shown at 569 and 670 and described in connection with FIG. 5 and FIG. 6, respectively, although embodiments are not intended to be limited to these types of memory devices.

The portions of example structural configurations 100 illustrated in FIG. 1 show a structural configuration at 101 as a comparative baseline for the reduction of crystal growth resulting from annealing a conductive material as described herein. As such, the structural configuration 101 shows a conductive material 106 (e.g., at least one noble metal described herein) that is selected to have an electrical resistance that may be reduced as a result of annealing the conductive material 106.

As described herein, such a conductive material may be formed from, in a number of embodiments, one or more noble metals. The noble metals may be selected from Ru, Rh, Pd, Ag, Os, Ir, Pt, and/or Au. Other possible conductive metals that may be formed as part of the conductive pathway described herein include iron (Fe), cobalt (Co), nickel (Ni), copper (Cu), molybdenum (Mo), tungsten (W), rhenium (Re), and mercury (Hg), among other possible metals with reduction of resistance and crystal growth characteristics resulting from annealing similar to those of the noble metals.

The conductive material 106 may be formed (e.g., deposited) to a thickness in the range of around 2-50 nm on a substrate material 104. The substrate material 104 may be formed to a thickness in a range of from around 2 nm to around 10 nm. In a number of embodiments, the substrate material 104 may be formed from titanium nitride (TiN), although other suitable substrate materials may be used. For example, one or more dielectric and/or resistor nitrides may be selected from boron nitride (BN), silicon nitride ($SiN_X$, $Si_3N_4$), aluminum nitride (AlN), gallium nitride (GN), tantalum nitride (TaN, $Ta_2N$), titanium nitride (TiN, $Ti_2N$), and tungsten nitride (WN, $W_2N$, $WN_2$), among other possibilities, for formation of the substrate material 104.

The structural configuration 101 including the conductive material 106 may undergo an anneal process 113. The anneal process 113 may be performed using a system 781 for implementation of semiconductor fabrication, including a processing apparatus 782, shown and described in connection with FIG. 7. The anneal process 113 may be performed using a temperature (energy) in a range of from around 300 degrees Celsius (° C.) to around 1100° C. The selected temperature, or sequence of temperatures, may be determined to be suitable for annealing a particular conductive material 106, or combination of conductive materials, selected from the options of conductive materials.

The system 781 for implementation of semiconductor fabrication and/or the processing apparatus 782 may be configured for deposition of atoms, ions, and/or compounds on a substrate. The interior of the processing apparatus 782, the atoms, ions, or compounds, and/or the substrate may have adjustable temperatures that may be controlled to be, in a number of embodiments, from at or below room temperature to the range of 300-1100° C. or higher. The anneal process 113 may be performed such that the conductive material 106 deposited on the substrate may subsequently have its temperature raised to initiate the anneal process 113 or a particular conductive material 106 may be formed (e.g., deposited) on the substrate at particular temperature selected for annealing the particular conductive material 106. For example, either the conductive material 106 or the substrate, or both, may have their temperature at the particular temperature selected as appropriate for annealing the particular conductive material 106 before deposition of the conductive material 106 on the substrate.

The particular conductive material 106 selected from the options may, for ease of reference, be referred to as Ru in connection with a number of embodiments herein. However, the embodiments are not intended to be limited to using Ru as the conductive material. When Ru is selected as the conductive material 106, the anneal process 113 may be performed at a temperature in a 600-700° C. range to cause linkages between atoms of the Ru to break when the elevated temperature to which the Ru is exposed causes the conductive material 106 to reach 600-700° C. Completion of the anneal process 113 on the structural configuration 101 may reduce the resistance of the conductive material 106. For example, a film of Ru (e.g., a thickness in the 2-50 nm range) may have a sheet resistance (RS) determined, or measured, as ohms per square (Ω/sq). Prior to annealing, the resistance of the Ru may be determined as being in a range of from around 15 Ω/sq to around 20 Ω/sq. Subsequent to (e.g., after) annealing, the resistance of the Ru may be reduced to being in a range of from around 7 Ω/sq to around 8 Ω/sq. The substrate material 104 may also be exposed to the anneal process 113. A particular substrate material 104 may, in a number of embodiments, be selected such that resistance thereof is affected by the selected temperature of the anneal process 113 less than (e.g., is unaffected by) the resistance of the selected conductive material 106.

Subsequent to performance of the anneal process 113 on the structural configuration 101, an annealed conductive material 115 (e.g., Ru) may have an exposed surface 116 (e.g., an upper surface opposite from a lower surface contiguous with the substrate material 104). The exposed surface 116 of the annealed Ru may, as a result of completion of the anneal process 113, be notably roughened by uninhibited crystal growth in the first dimension. For example, the roughness on the exposed surface 116 of the annealed Ru may be determined, or measured, as an arithmetic average roughness ($R_a$) that provides a roughness parameter profile on a line across the exposed surface 116. An $R_a$ for the uninhibited crystal growth toward (e.g., on) the exposed surface 116 of the annealed Ru may be determined to have a parameter value of approximately 1.6.

In contrast to the structural configuration shown at 101, the structural configurations shown at 102-1 and 102-2 include a stabilizing material 109 formed (e.g., deposited) on a surface 110 of the conductive material 106. The surface 110-1 of the conductive material 106 shown in configuration 102-1 and the surface 110-2 of the conductive material 106 shown in configuration 102-2 may each correspond to the formerly exposed surface 108 of the structural configuration shown at 101 after being covered with the stabilizing material 109.

The stabilizing material 109 may be formed as a thin film on the surface 110 of the conductive material 106. As such, the stabilizing material 109 may be deposited to a thickness that is less (thinner) than a potentially thinnest 2.0 nm thickness of the conductive material 106. Hence, the stabilizing material 109 may, in a number of embodiments, be deposited to a thickness of 1.0 nm or less. A thin film of a selected stabilizing material 109 formed to a thickness of 1.0 nm or less may be termed an "ultra-thin film" in semiconductor fabrication.

The configuration shown at 102-1 differs from the configuration shown at 102-2 in that the stabilizing material 109-1 in configuration 102-1 is formed (e.g., deposited) to a thickness 111-1 that is greater than a thickness 111-2 of the stabilizing material 109-2 shown in configuration 102-1. For example, the thickness 111-1 of the stabilizing material 109-1 shown in configuration 102-1 may be around 1.0 nm and the thickness 111-2 of the stabilizing material 109-2 shown in configuration 102-2 may be around 0.5 nm. Structural configurations 102-1, 102-2 are intended to show that the thickness 111-1 of the stabilizing material 109-1 is around double that of the thickness 111-2 of the stabilizing material 109-2; however, embodiments are not limited to these specific thicknesses of the stabilizing material 109.

The stabilizing material 109 may be selected to have a number of properties that include stabilization of the reduced electrical resistance of the conductive material 106 and reduction of a degree of freedom of crystal growth relative to the surface 110 (e.g., in the first dimension) resulting from recrystallization of the conductive material 106 during annealing (e.g., during the cooling of the anneal process 113). The stabilizing material 109 may be, or be formed from, a nitride of an element selected from the "refractory metals" in the periodic table. The refractory metals tend to be resistant to heat and wear in semiconductor devices and nitrides thereof may have the just-presented properties.

Such a stabilizing material 109 may be formed from nitrides of one or more refractory metals. The refractory metals may be selected from titanium (Ti), vanadium (V), chromium (Cr), zirconium (Zr), niobium (Nb), molybdenum (Mo), hafnium (Hf), tantalum (Ta), and/or tungsten (W). In a number of embodiments, nitrides of either nickel-platinum ($NiPt_3$) or boron (B), among other possible elements and/or compounds, may be utilized as a stabilizing material 109 that has stabilizing and crystal growth reduction properties similar to those of the refractory metals. The nitrides potentially used for the stabilizing material 109 may include different numbers or ratios of nitrogen atoms bonded to the other element and/or compound. For example, the nitrides used for the stabilizing material 109 may include titanium nitride (TiN, $Ti_2N$), tantalum nitride (TaN, $Ta_2N$), tungsten nitride (WN, $W_2N$, $WN_2$), and boron nitride (BN), among other possibilities. The conductive material 106 and the stabilizing material 109 may, in a number of embodiments, be formed from different materials. For example, the conductive material 106 may be formed from Ru and the stabilizing material 109 may be a nitride of Ti (e.g., TIN), rather than a nitride of Ru. The particular stabilizing material 109 selected from the options may, for ease of reference, be referred to as TiN in connection with a number of embodiments herein. However, the embodiments are not intended to be limited to using TiN as the stabilizing material.

As shown in structural configuration 102-1 of FIG. 1, the stabilizing material 109-1 may, for example, be formed to a thickness 111-1 of around 1.0 nm on an exposed surface 110-1 of the conductive material 106. In a number of embodiments, the stabilizing material 109-1 may be formed from at least one of the refractory metals (e.g., TiN) and the conductive material 106 may be formed from at least one of the noble metals (e.g., Ru). After forming the stabilizing material 109-1 on the formerly exposed surface 110-1 of the conductive material 106, an upper surface of the stabilizing material 109-1 may become a newly exposed surface 112-1 of stabilizing material 109-1.

Subsequent to performance of the anneal process 113 on the structural configuration 102-1, an annealed conductive material 117-1 (e.g., Ru) may have its formerly exposed and now annealed surface 118-1 roughened to some degree. However, as a result of the thickness 111-1 (e.g., 1.0 nm) of the stabilizing material 109-1 deposited contiguous to the formerly exposed surface 110-1, the annealed surface 118-1 of the Ru may be notably less roughened in comparison to the roughness on the exposed surface 116 described in connection with structural configuration 101 where no stabilizing material 109 is formed over (e.g., on) the Ru. The annealed surface 118-1 may be less roughened resulting from reduction (e.g., inhibition, prevention, etc.) of Ru crystal growth in the first dimension. For example, the roughness on the annealed surface 118-1 of the Ru may be determined, or measured, to have an $R_a$ parameter value of approximately 0.5, in contrast to the $R_a$ parameter value of approximately 1.6 for the uninhibited crystal growth in the first dimension toward the exposed surface 116 of the annealed Ru when the stabilizing material 109-1 is not formed on the Ru.

As such, forming the stabilizing material 109-1 (e.g., TiN) on the conductive material 106 (e.g., Ru) to a thickness 111-1 of around 1.0 nm prior to performance of the anneal process 113 may reduce the roughness on the annealed surface 118-1 approximately 70% relative to exposed surface 116 based on comparison of the $R_a$ parameter values. In contrast to reduction of the crystal growth in the first dimension based on the presence of TiN as the stabilizing material 109-1, and the resultant reduction of the roughness the annealed surface 118-1 of the Ru, the resistance of the annealed Ru still may be reduced to being in the same range of around 7-8 Ω/sq as determined for the conductive material 106 when no stabilizing material 109 is formed thereon. As such, the presence of the stabilizing material 109-1 formed at the thickness 111-1 of around 1.0 nm may stabilize the reduced electrical resistance of the annealed conductive material 117-1, as described further herein.

The roughness formed on the surface 118-1 of the annealed conductive material 117-1 (e.g., Ru) may exert pressure in the first dimension to a contiguous surface of an overlying annealed stabilizing material 119-1 (e.g., TiN). The pressure in the first dimension may cause (e.g., force) a corresponding roughness to form on an exposed surface 120-1 of annealed stabilizing material 119-1. However, the roughness on the exposed surface 120-1 of the annealed stabilizing material 119-1 may correspond to (e.g., be substantially the same as or less than) the $R_a$ parameter value of approximately 0.5 for the annealed surface 118-1 of the Ru, rather than approximately 1.6 resulting from the uninhibited crystal growth for exposed surface 116 in structural configuration 101.

As shown in structural configuration 102-2 of FIG. 1, the stabilizing material 109-2 may, for example, be formed to a thickness 111-2 of around 0.5 nm on an exposed surface 110-2 of the conductive material 106, rather than the 1.0 nm thickness 111-1 described in connection with configuration 102-1. Similar to configuration 102-1, the stabilizing material 109-2 shown in configuration 102-2 may, in a number of embodiments, be formed from at least one of the refractory metals (e.g., TiN) and the conductive material 106 may be formed from at least one of the noble metals (e.g., Ru). For example, after forming the TiN on the formerly exposed surface 110-2 of the Ru, an upper surface of the TiN may become a newly exposed surface 112-2 of the TiN.

Subsequent to performance of the anneal process 113 on the structural configuration 102-2, the formerly exposed and now annealed surface 118-2 of the annealed conductive material 117-2 (e.g., Ru) may be roughened to some degree. However, as a result of the thickness 111-2 of the stabilizing material 109-2 deposited contiguous to the formerly exposed surface 110-2 being around 0.5 nm, the annealed surface 118-2 of the Ru may be notably less roughened. The annealed surface 118-2 of the Ru is less rough in comparison to the roughness on the exposed surface 116 described in connection with structural configuration 101 where no stabilizing material 109 is formed on the Ru. For example, the roughness on the annealed surface 118-2 of the Ru may be determined to have an $R_a$ parameter value of approximately 0.3, in contrast to the $R_a$ parameter value of approximately 1.6 for the uninhibited crystal growth toward the exposed surface 116 of the annealed Ru. As such, forming the stabilizing material 109-2 (e.g., TiN) on the conductive material 106 (e.g., Ru) to a thickness 111-2 of around 0.5 nm prior to performance of the anneal process 113 may reduce the roughness on the annealed surface 118-2 approximately 80% relative to exposed surface 116 based on comparison of the $R_a$ parameter values.

The thickness 111-2 of the stabilizing material 109-2 shown in configuration 102-2 is less than (e.g., about half of) the thickness 111-1 of the stabilizing material 109-1 shown in configuration 102-1. Nonetheless, the roughness of the annealed surface 118-2 of the Ru is reproducibly less than the roughness on the annealed surface 118-1 shown in configuration 102-1. For example, the $R_a$ parameter value of approximately 0.3 for the roughness on the annealed surface 118-2 of Ru shown in configuration 102-2 is less than the $R_a$ parameter value of approximately 0.5 for the annealed surface 118-1 of the Ru shown in configuration 102-1. As such, forming the stabilizing material 109-2 (e.g., TiN) on the conductive material 106 (e.g., Ru) to a thickness 111-2 of around 0.5 nm prior to performance of the anneal process 113 may reduce the roughness on the annealed surface 118-2 approximately 40% relative to annealed surface 118-1 based on comparison of the $R_a$ parameter values. The annealed surface 118-2 may be less roughened than annealed surface 118-1 resulting from further reduction (e.g., inhibition, prevention, etc.) of Ru crystal growth in the first dimension.

In contrast to the further reduction of the crystal growth in the first dimension based on the presence of TiN as the stabilizing material 109-2, and the resultant reduction of the roughness the annealed surface 118-2 of the Ru, the resistance of the annealed Ru still may be reduced to being in the same range of around 7-8 Ω/sq as determined for the conductive material 106 when no stabilizing material 109 is formed thereon and as determined for the conductive material 106 when around 1.0 nm of stabilizing material 109-1 is formed thereon. As such, the presence of the stabilizing material 109-2 formed at the thickness 111-2 of around 0.5 nm also may stabilize the reduced electrical resistance of the annealed conductive material 117-2, as described further herein.

As described in connection with configuration 102-1, the roughness formed on the surface 118-2 of the annealed conductive material 117-2 (e.g., Ru) shown in configuration 102-2 may exert pressure in the first dimension to a contiguous surface of an overlying annealed stabilizing material 119-2 (e.g., TiN). The pressure in the first dimension may force a corresponding roughness to form on an exposed surface 120-2 of annealed TiN. However, the roughness on the exposed surface 120-2 of the annealed TiN may correspond to the $R_a$ parameter value of approximately 0.3 for the annealed surface 118-2 of the Ru, rather than approximately 1.6 resulting from the uninhibited crystal growth for exposed surface 116 in structural configuration 101 or approximately 0.5 resulting from the reduced crystal growth for the annealed surface 118-1 of the Ru in configuration 102-1.

A particular stabilizing material 109 may, in a number of embodiments, be selected such that resistance of the annealed stabilizing materials 119-1 and 119-2 is affected by the selected temperature of the anneal process 113 less than (e.g., is unaffected by) the effect (e.g., reduction) on resistance of the annealed conductive materials 117-1 and 117-2. In a number of embodiments, the selected stabilizing material 109 may be the same as the selected substrate material 104 (e.g., both being TiN) such that crystal growth in the first dimension toward the substrate material 104 is reduced similar to the reduction of the crystal growth toward the stabilizing material 109.

The stabilizing material 109 described herein may be selected to have a property for stabilization of the reduced electrical resistance of the conductive material 106. The refractory metals used to form the nitrides of the stabilizing material 109 and the noble metals used to form the conductive material 106 may both be in the "transition metals" group in the periodic table of elements. Atoms of the transition metal group, even from different elements of the group, may have a tendency (e.g., a preference) to associate more stably with each other than a combination of atoms where at least one of which is not a transition metal. As such, the Ti atoms of a TiN stabilizing material 109 deposited on a conductive material 106 (e.g., formed from Ru) may form relatively stable connections with the Ru atoms in a region near the surface 110 of the conductive material 106.

For example, the positioning or alignment of the TiN atoms in the stabilizing material 109 may form a template for connection to the Ru atoms in the region near the surface 110 of the conductive material 106 to stabilize the reduced electrical resistance resulting from performance of the anneal process 113 on the conductive material 106. The stable connection between the TiN atoms in the stabilizing material 109 and the Ru atoms in the conductive material 106 may contribute to more uniformity in grain (crystal) size and/or boundaries during recrystallization of the conductive material 106. Such increased uniformity may contribute to stabilization of the reduced electrical resistance, among other possibilities.

The selected stabilizing material 109 may reduce a scattering of electrons to contribute to the stabilization of the reduced electrical resistance. For example, the increased crystal uniformity may reduce electron scattering, with resultant reduction in energy loss, to contribute to the stabilization of the reduced electrical resistance. Alternatively or in addition, the selected stabilizing material 109 may reduce production of phonons to contribute to the stabilization of the reduced electrical resistance. For example, a high level of electron scattering in the conductive material 106 may increase the temperature of the conductive material 106 as a consequence of production of an increased number of phonons. An increase in the temperature of the conductive material 106 may increase, rather than decrease, the resistance of the conductive material 106. Accordingly, reduction of the electron scattering (e.g., resulting from the increased crystal uniformity or otherwise) may reduce (e.g., prevent) potential production of increased numbers of phonons, and the resultant increased temperature, to contribute to the stabilization of the reduced electrical resistance.

The stabilizing material 109 described herein also may be selected to have a property for reduction of the degree of freedom of crystal growth relative to the surface 110 resulting from recrystallization of the conductive material 106 during the annealing. As determined by results of tests performed on a number of combinations of the stabilizing materials 109 and the conductive materials 106 described herein, the roughness on the surface 110 of the conductive material 106 is notably reduced as a consequence of reduction of the degree of freedom of crystal growth in the first dimension when the stabilizing material 109 is formed thereon. The reduction of roughness is determined relative to the roughness (e.g., the $R_a$ parameter value) described as a result of annealing 113 in connection with structural configuration 101 in FIG. 1.

Figure 2:
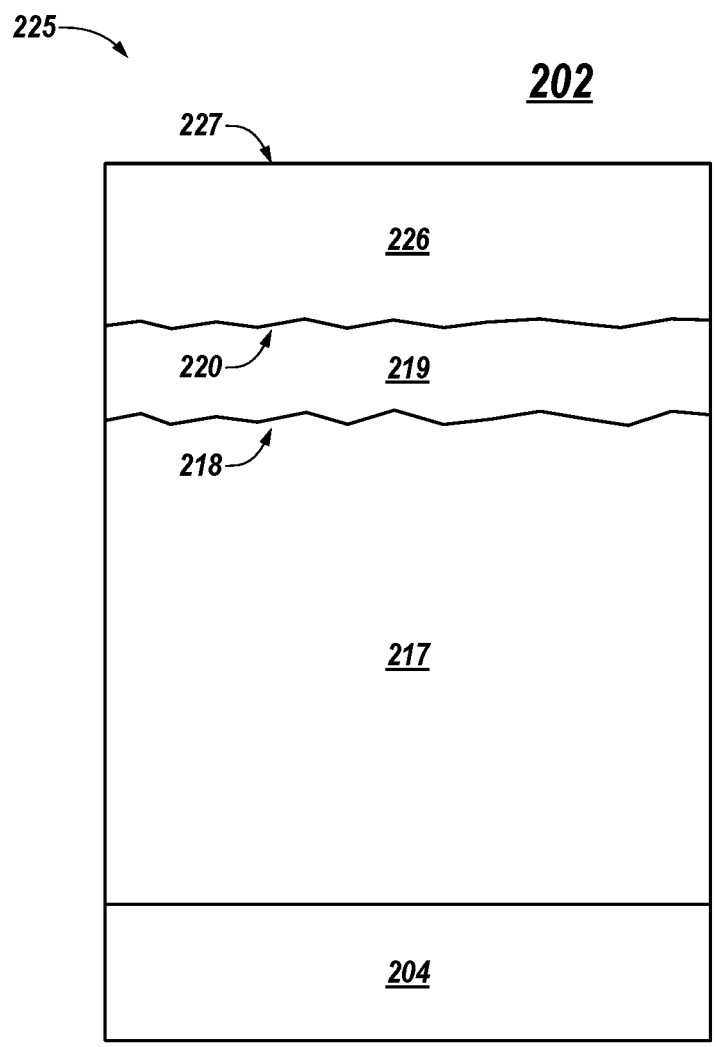
FIG. 2 illustrates a cross-sectional view of an example of another material formed over the portion of the conductive material on which the crystal growth is reduced in accordance with a number of embodiments of the present disclosure.

FIG. 2 illustrates a cross-sectional view 225 of an example of another material 226 formed on a portion of an annealed stabilizing material 219 and over a portion of a conductive material 217 on which the crystal growth is reduced in accordance with a number of embodiments of the present disclosure. The cross-sectional view 225 illustrated in FIG. 2 shows an example of a structural configuration 202 that may correspond to structural configurations 102-1 and 102-2 after performance of the anneal process 113 described in connection with FIG. 1.

As such, the cross-sectional view 225 shows a substrate 204, the annealed conductive material 217, and the annealed stabilizing material 219. A surface 218 of the annealed conductive material 217 is shown contiguous to the annealed stabilizing material 219. The annealed surface 218 may be roughened to some degree as a result of performance of the anneal process 113, as described in connection with FIG. 1. However, the roughness (e.g., determined by the $R_a$ parameter value) of the annealed surface 218 may be notably reduced relative to a surface 116 of an annealed conductive material 115 that did not have a stabilizing material 109 formed thereon prior to performance of the anneal process 113.

As described in connection with FIG. 1, the annealed stabilizing material 219 may have had an exposed surface 112 prior to formation (e.g., deposition) of the other material 226 thereon. The exposed surface 112 may have been roughened to a degree corresponding, in various embodiments, to the roughness on the annealed surface 218 of the annealed conductive material 217. The exposed surface 112 may become a formerly exposed surface 220 of the annealed conductive material 217 following formation of the other material 226 thereon. The other material 226 may then have a newly exposed surface 227 of the structural configuration 202. The newly exposed surface 227 of the other material 227 may have a roughness ($R_a$) that is less than the roughness of the surface 218 of the annealed conductive material 217 and/or the previously exposed surface 112 of the annealed stabilizing material 219. The exposed surface 227 of the other material 227 may have a roughness comparable to a relative smoothness of the surfaces of the conductive material 106 and/or the stabilizing material 109 prior to performance of the anneal process 113 thereon (e.g., having a $R_a$ parameter value in a range of from around 0.0 to around 0.1).

The other material 227 may, in a number of embodiments, be formed, or used, as an insulator material on (e.g., covering) the formerly exposed 220 of the annealed stabilizing material 219. The relative smoothness of the exposed surface 227 of the insulator material may facilitate interaction with (e.g., connection to) other components of, for example, a memory device as shown at 568 and 670 in connection with FIG. 5 and FIG. 6, respectively. The insulator material also may provide protection to the annealed conductive material 217 and the annealed stabilizing material 219 used to form, for example, access lines, sense lines, and/or electrodes, as described in connection with FIG. 6. The protection may be from unintended exposure to electrical potential and/or current, heat, and/or humidity, among other possibilities.

The other material 227 may, in a number of embodiments, be formed (e.g., deposited) as, for example, silicon nitride ($Si_3N_4$) to function as a passivation material on (e.g., covering) the formerly exposed 220 of the annealed stabilizing material 219 (e.g., the nitride of the refractory metal). As used herein, "passivation" is intended to refer to a chemical compound (a passivation material) being formed over a structural material of a semiconductor device in order to provide a barrier to reduce a potential for removal of (e.g., to protect) the structural material resulting from unintended consequences of subsequent processing of the semiconductor device. As described herein, the passivation material may be formed over (e.g., on) either the stabilizing material 109 prior to performance of the anneal process 113 or on the annealed stabilizing material 219 subsequent to performance of the anneal process 113 to, for example, protect an underlying stabilizing material from unintended consequences of processing (fabrication) of the semiconductor device to remove a material associated with a top region thereof. However, such processing also may result in removal of an amount (e.g., a thickness, height, and/or mass) of the passivation material. The amount of the passivation material to be removed as such may be included in the original passivation material to enable a remaining passivation material to be sufficient to protect the underlying stabilizing material from unintended consequences of downstream fabrication.

The other material 226 may be formed (e.g., deposited) to a thickness in a range of from around 2.0 nm to around 1500 nm. The particular thickness selected may depend on whether the other material 226 is to be used as the insulating material or the passivation material and on which underlying materials are intended to be insulated and/or passivated. In a number of embodiments, a same material may be utilized as the other material 226 in order to perform either, or both, of the insulation and passivation functions. For example, $Si_3N_4$ may be selected to perform the insulation and passivation functions. Hence, TiN may be deposited as the nitride of the refractory metal to function as the stabilizing material 109 prior to performance of the anneal process 113 and $Si_3N_4$ may be deposited as the passivation material 109, 119 on the exposed surface 220 of the nitride of the refractory metal either before or after performance of the anneal process 113.

FIG. 3 is a flow diagram of an example method 340 for reduction of crystal growth resulting from annealing a conductive material in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 342, the method 340 may include forming a stabilizing material on an exposed surface of a conductive material (e.g., as described in connection with structural configurations 102-1 and 102-2 in FIG. 1). At block 344, the method 340 may include annealing the conductive material and the stabilizing material to reduce an electrical resistance of the conductive material (e.g., as described in connection with FIG. 1 concerning the anneal process 113). At block 346, the method 340 may further include reducing crystal growth of the conductive material toward the stabilizing material, resulting from presence of the formed stabilizing material during the annealing, to reduce a roughness on the formerly exposed surface of the conductive material (e.g., as described in connection with FIG. 1 concerning the roughness of the annealed surface 118 of the annealed conductive material 117).

The method 340 may, in a number of embodiments, further include forming the conductive material and the stabilizing material from different materials (e.g., forming the conductive material from Ru and the stabilizing material from TiN). The method 340 may further include enabling the crystal growth, from recrystallization of the conductive material during the annealing, in directions other than toward the stabilizing material to contribute to reduction of an electrical resistance of the conductive material. The method 340 may further include reducing elevation of a portion of the annealed stabilizing material, resulting from the reduced crystal growth of the annealed conductive material toward the stabilizing material, to reduce a roughness on an exposed surface of the annealed stabilizing material (e.g., as described in connection with FIG. 1 concerning the reduced roughness of the annealed surface 118 of the annealed conductive material 117 and the corresponding roughness on the exposed surface 120 of the annealed stabilizing material 119).

The method 340 may further include utilizing a subtractive etch process to form the conductive material and the stabilizing material as at least one of an access line, a sense line, and an electrode for a semiconductor memory device. For example, various deposition processes may be used to form (e.g., deposit) the various substrate, conductive, stabilizing, insulator, and/or passivation materials, among others, used to form the components described herein (e.g., the access lines, sense lines, and electrodes shown and described in connection with FIG. 6 and using a system for implementation of semiconductor fabrication processes shown and described in connection with FIG. 7). The various materials may be deposited using processes such as diffusion, spin-on deposition, physical vapor deposition, chemical vapor deposition, plasma-enhanced chemical vapor deposition, pulsed laser deposition, sputter deposition, atomic layer deposition, among other suitable deposition processes. The subtractive etch process (e.g., any suitable wet etch or dry etch process) may be used to remove specific portions of the various materials such that the remaining materials contribute to formation of the intended components. Alternatively or in addition, the method 340 may further include utilizing an additive (e.g., damascene) deposition process to form the conductive material and the stabilizing material as at least one of an access line, a sense line, and an electrode for the semiconductor memory device. The damascene process may, for example, use chemical mechanical planarization (CMP) instead of a subtractive etch process.

FIG. 4 is a flow diagram of another example method 450 for reduction of crystal growth resulting from annealing a conductive material in accordance with a number of embodiments of the present disclosure.

At block 451, the method 450 may include depositing a noble metal as a conductive material on a surface of a substrate material (e.g., as described in connection with structural configurations 101, 102-1, and 102-2 in FIG. 1). At block 453, the method 450 may include depositing a nitride of a refractory metal as a stabilizing material on an exposed surface of the noble metal (e.g., as described in connection with structural configurations 102-1 and 102-2). At block 455, the method 450 may include annealing the noble metal and the nitride of the refractory metal to reduce an electrical resistance of the noble metal (e.g., as described in connection with structural configurations 102-1 and 102-2). At block 457, the method 450 may include reducing crystal growth of the noble metal above a level of the formerly exposed surface of the noble metal, resulting from presence of the formed nitride of the refractory metal during the annealing, to reduce a roughness (e.g., as described in connection with structural configurations 102-1 and 102-2). At block 459, the method 450 may further include the roughness being reduced on the formerly exposed surface of the noble metal and/or on an exposed surface of the nitride of the refractory metal (e.g., as described with regard to surfaces 118 and 120 in connection with structural configurations 102-1 and 102-2).

The method 450 may further include reducing a potentially increased capacitance of the conductive material, resulting from crystal growth of the noble metal above the level of the formerly exposed surface of the noble metal, by stabilization of the level using the deposited nitride of the refractory metal. Reducing (e.g., preventing) the potentially increased capacitance of the conductive material may, for example, reduce a probability for capacitive coupling between structural components (e.g., access lines, sense lines, and/or electrodes) that include such conductive materials.

The method 450 may further include removing (e.g., by etching and/or CMP) the nitride of the refractory metal (the annealed stabilizing material 119) to a level of a re-exposed surface of the annealed noble metal (e.g., as described with regard to originally exposed surfaces 108, 110-1, and 110-2 of conductive material 106 in connection with structural configurations 101, 102-1, and 102-2). As such, the reduced roughness on the re-exposed surface may be retained (or improved). Moreover, the reduced electrical resistance of the noble metal also may be retained due to the stabilization of the reduced electrical resistance of the annealed conductive material 117 resulting from the former presence of the stabilizing material 109 during the anneal process 113.

The method 450 may further include removing (e.g., by etching and/or CMP) the nitride of the refractory metal to an intended thickness. The intended thickness may be total removal of the annealed stabilizing material to the level of the re-exposed surface of the annealed noble metal or the intended thickness may leave a portion of the original thickness of the annealed stabilizing material on the annealed conductive material. The intended thickness may be determined by a CD that defines a final structure or intermediary structures of a semiconductor device. For example, at least a portion of the thickness of the annealed stabilizing material may be removed because it extends into an area or space intended to be occupied by other structural components (e.g., CDs of a final structure or intermediary structures of a memory device), among other possible determinants of the intended thickness.

Figure 5:
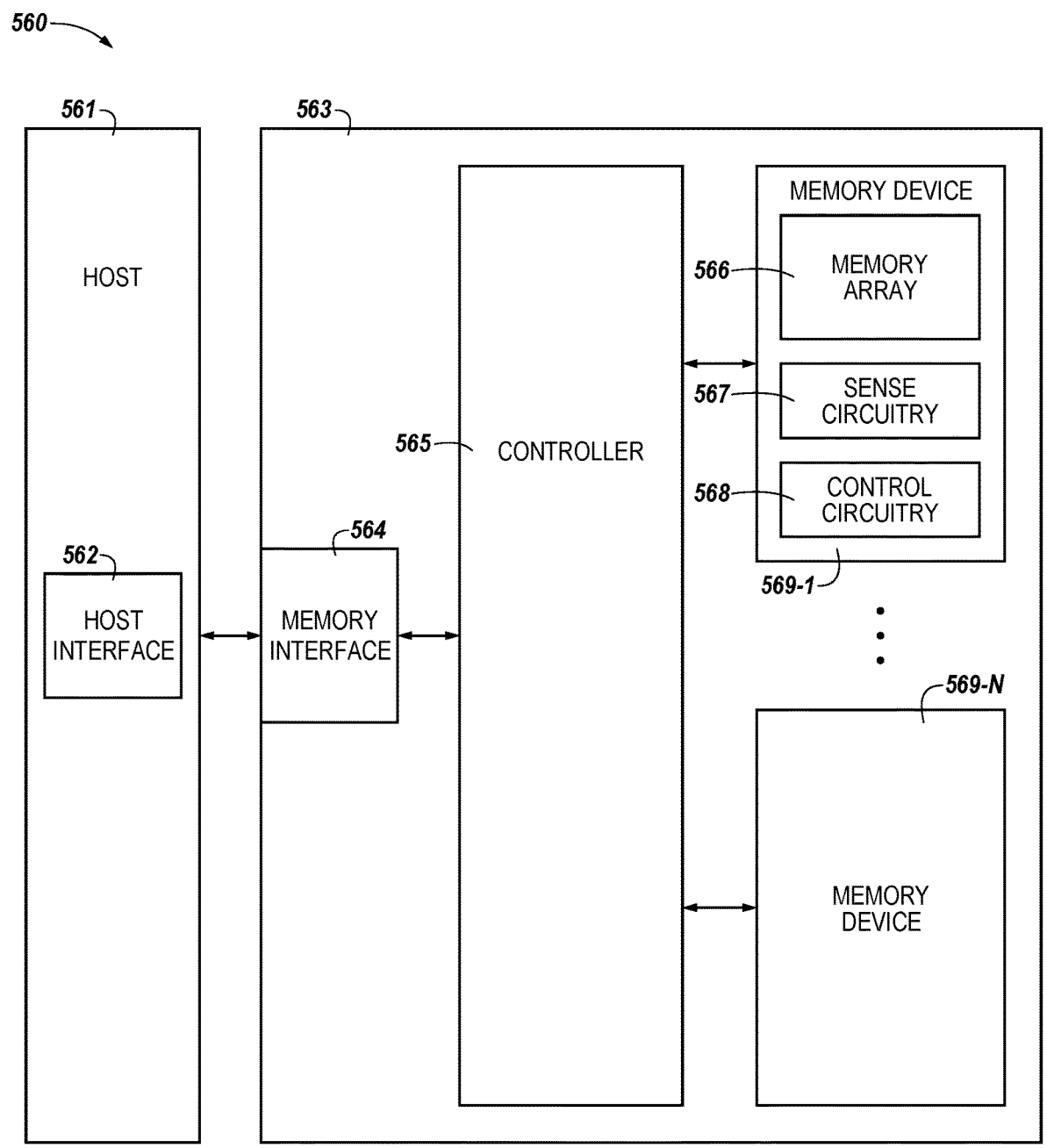
FIG. 5 is a functional block diagram of a computing system including at least one memory system in accordance with one or more embodiments of the present disclosure.

FIG. 5 is a functional block diagram of a computing system 560 including at least one memory system 563 in accordance with one or more embodiments of the present disclosure. Memory system 563 may be, for example, a solid-state drive (SSD).

In the embodiment illustrated in FIG. 5, memory system 563 includes a memory interface 564, a number of memory devices 569-1, . . . , 569-N, and a controller 565 selectably coupled to the memory interface 564 and memory devices 569-1, . . . , 569-N. Memory interface 564 may be used to communicate information between memory system 563 and another device, such as a host 561. Host 561 may include a processor (not shown). As used herein, "a processor" may be a number of processors, such as a parallel processing system, a number of coprocessors, etc. Example hosts may include, or by implemented in, laptop computers, personal computers, digital cameras, digital recording devices and playback devices, mobile telephones, PDAs, memory card readers, interface hubs, and the like. Such a host 561 may be associated with fabrication operations performed on semiconductor devices and/or SSDs using, for example, a processing apparatus.

In a number of embodiments, host 561 may be associated with (e.g., include or be coupled to) a host interface 562. The host interface 562 may enable input of scaled preferences (e.g., in numerically and/or structurally defined gradients) to define, for example, critical dimensions (CDs) of a final structure or intermediary structures of a memory device (e.g., as shown at 569) and/or an array of memory cells (e.g., as shown at 566) formed thereon. The scaled preferences may be provided to the host interface 562 via input of a number of preferences stored by the host 561, input of preferences from another storage system (not shown), and/or input of preferences by a user (e.g., a human operator).

Memory interface 564 may be in the form of a standardized physical interface. For example, when memory system 563 is used for information (e.g., data) storage in computing system 560, memory interface 564 may be a serial advanced technology attachment (SATA) interface, a peripheral component interconnect express (PCIe) interface, or a universal serial bus (USB) interface, among other physical connectors and/or interfaces. In general, however, memory interface 564 may provide an interface for passing control, address, information, scaled preferences, and/or other signals between the controller 565 of memory system 563 and a host 561 (e.g., via host interface 562).

Controller 565 may include, for example, firmware and/or control circuitry (e.g., hardware). Controller 565 may be operably coupled to and/or included on the same physical device (e.g., a die) as one or more of the memory devices 569-1, . . . , 569-N. For example, controller 565 may be, or may include, an ASIC as hardware operably coupled to circuitry (e.g., a printed circuit board) including memory interface 564 and memory devices 569-1, . . . , 569-N. Alternatively, controller 565 may be included on a separate physical device that is communicatively coupled to the physical device (e.g., the die) that includes one or more of the memory devices 569-1, . . . , 569-N.

Controller 565 may communicate with memory devices 569-1, . . . , 569-N to direct operations to sense (e.g., read), program (e.g., write), and/or erase information, among other functions and/or operations for management of memory cells. Controller 565 may have circuitry that may include a number of integrated circuits and/or discrete components. In a number of embodiments, the circuitry in controller 565 may include control circuitry for controlling access across memory devices 569-1, . . . , 569-N and/or circuitry for providing a translation layer between host 561 and memory system 563.

Memory devices 569-1, . . . , 569-N may include, for example, a number of memory arrays 566 (e.g., arrays of volatile and/or non-volatile memory cells). For instance, memory devices 569-1, . . . , 569-N may include arrays of memory cells, such as a portion of an example memory device 670 structured to include access lines, sense lines, and electrodes described in connection with FIG. 6. As will be appreciated, the memory cells in the memory arrays 566 of memory devices 569-1, . . . , 569-N and/or as shown at 670 may be in a RAM architecture (e.g., DRAM, SRAM, SDRAM, FeRAM, MRAM, ReRAM, etc.), a flash architecture (e.g., NAND, NOR, etc.), a three-dimensional (3D) RAM and/or flash memory cell architecture, or some other memory array architecture including pillars and adjacent trenches.

Memory devices 569, 670 may be formed on the same die. A memory device (e.g., memory device 569-1) may include one or more arrays 566 of memory cells formed on the die. A memory device may include sense circuitry 567 and control circuitry 568 associated with one or more arrays 566 formed on the die, or portions thereof. The sense circuitry 567 may be utilized to determine (sense) a particular data value (e.g., 0 or 1) that is stored at a particular memory cell in a row of an array 566. The control circuitry 568 may be utilized to direct the sense circuitry 567 to sense particular data values, in addition to directing storage, erasure, etc., of data values in response to a command from host 561 and/or host interface 562. The command may be sent directly to the control circuitry 568 via the memory interface 564 or to the control circuitry 568 via the controller 565.

The embodiment illustrated in FIG. 5 may include additional circuitry that is not illustrated so as not to obscure embodiments of the present disclosure. For example, memory devices 569, 670 may include address circuitry to latch address signals provided over I/O connectors through I/O circuitry. Address signals may be received and decoded by a row decoder and a column decoder to access a memory array 566. It will be appreciated that the number of address input connectors may depend on the density and/or architecture of memory devices 569, 670 and/or memory arrays 566.

Figure 6:
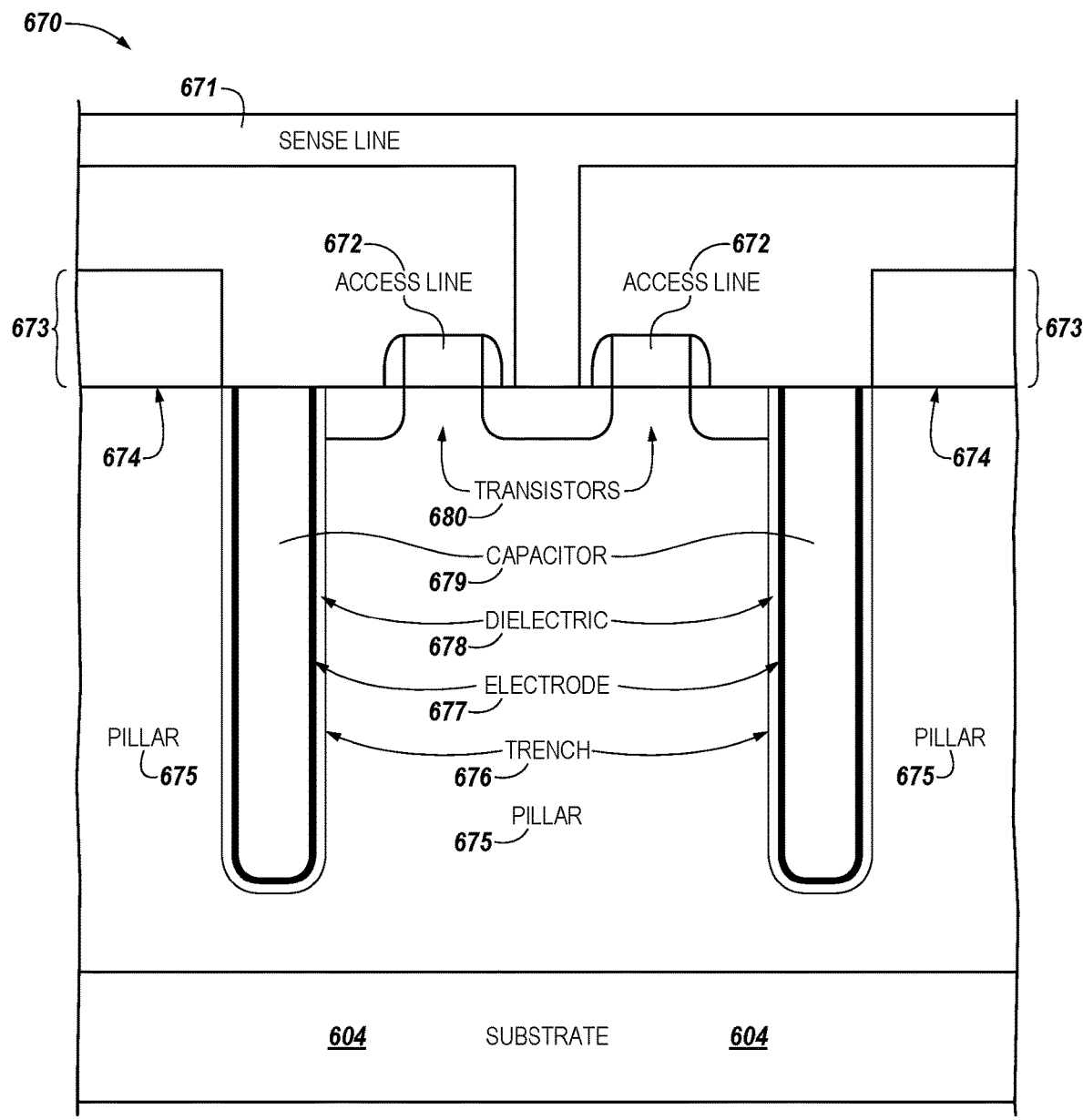
FIG. 6 illustrates a cross-sectional view of a portion of an example of semiconductor structures of a memory device that include access lines, sense lines, and electrodes in accordance with a number of embodiments of the present disclosure.

FIG. 6 illustrates a cross-sectional view of a portion of an example of semiconductor structures of a memory device 670 that include access lines, sense lines, and electrodes in accordance with a number of embodiments of the present disclosure. The portion of the memory device 670 illustrated in FIG. 6 is shown by way of example and not by way of limitation to include a DRAM memory cell architecture. Another RAM, flash (e.g., NAND or NOR), and/or 3D memory cell architecture also may include pillars and adjacent trenches. Embodiments are not so limited. Although the DRAM transistors 680 and capacitors 679 are shown to be arranged in a lateral configuration, embodiments may include the transistors 680 and capacitors 679 being arranged in a lateral, a vertical, or any other configuration.

The portion of the memory device 670 shown in FIG. 6 may represent two DRAM memory cells in a 1T1C (one transistor one capacitor) configuration or one DRAM memory cell in a 2T2C configuration. DRAM memory cells may utilize capacitors 679 each formed in a trench 676 to store a particular charge corresponding to a data value. Forming the trenches 676 as shown in FIG. 6 may result in a pillar 675 being formed from the etched material on each side of a trench 676. Pillars 675 may be formed (e.g., fabricated) as layers of doped or undoped semiconductor material deposited on a substrate material 604, which may be the same or different from the substrate material 104 shown and described in connection with FIG. 1 and elsewhere herein. The semiconductor material may be etched to form the pillars 675 and trenches 676.

Embodiments of the present disclosure are not limited to capacitors being formed in a trench for data storage, nor are embodiments limited to the trench containing capacitor material. For example, various types of memory devices may include trenches between sidewall structures (e.g., pillars) in which various materials may be positioned to contribute to data access, storage, and/or processing or in which various materials may be formed for electrical conduction and/or isolation (e.g., conductor, resistor, and/or dielectric materials), among other functions and/or operations.

In a number of embodiments, a trench 676 may be etched to a particular depth into a pillar material. The trench 676 may be etched into the material of the pillars 675 to a depth approaching the substrate material 604, as shown in FIG. 6. Alternatively, the trench 676 may be etched into the material of the pillars 675 to a top of or into the substrate material 604.

A conductive material, as described herein, may be formed as a first electrode 677 over (e.g., on) an outer surface of the capacitor material 679. A dielectric material 678 may be formed on an outer surface of the first electrode 677. The capacitor 679 may be subsequently formed, at least in part, by formation of additional conductive material between an inner surface of the trench 676 and an outer surface of the dielectric material 678 as a second electrode (not shown). The electrodes may include, or be formed from, conductive material that has been processed to reduce the crystal growth resulting from annealing, as described in connection with FIG. 1.

Each pillar 675 of the pillar material may extend to a particular height above the substrate material 604. As such, each pillar 675 has a top surface 674 at the particular height. A number of structural materials may be formed on or in association with the top surface 674 of the pillar 675 adjacent the trench 676. For example, a particular material 673 may be formed to contribute to data access, storage, and/or processing (e.g., conductor, resistor, and/or dielectric materials). Such a material 673 may be formed on the top surface 674 of the pillar 675 adjacent the trench 676. A mask material (not shown) may be formed to protect an underlying particular material 673 and/or the top surface 674 of the pillar 675 adjacent the trench 676 from subsequent processing and/or wear encountered in use of the memory device 670. Such a mask material may be formed by processing (e.g., annealing) a conductor material with a stabilizing material formed thereon as described herein.

Other structural materials may be formed (e.g., in a DRAM configuration as shown in FIG. 6) on or in association with the top surface 674 of the pillar 675 adjacent the trench 676. The other structural materials may include the transistors 680, access lines 672, and sense lines 671, among other possible structural materials. The access lines 672 and/or sense lines 671 may include, or be formed from, conductive material that has been processed to reduce the crystal growth resulting from annealing, as described in connection with FIG. 1. The other structural materials also may include other electrodes (not shown), which may be processed as described herein. The other electrodes may be electrically coupled to the access lines 672 and/or sense lines 671 or the electrodes may be electrically coupled to other components of the memory device 670 and/or of the computing system 560 described in connection with FIG. 5.

Figure 7:
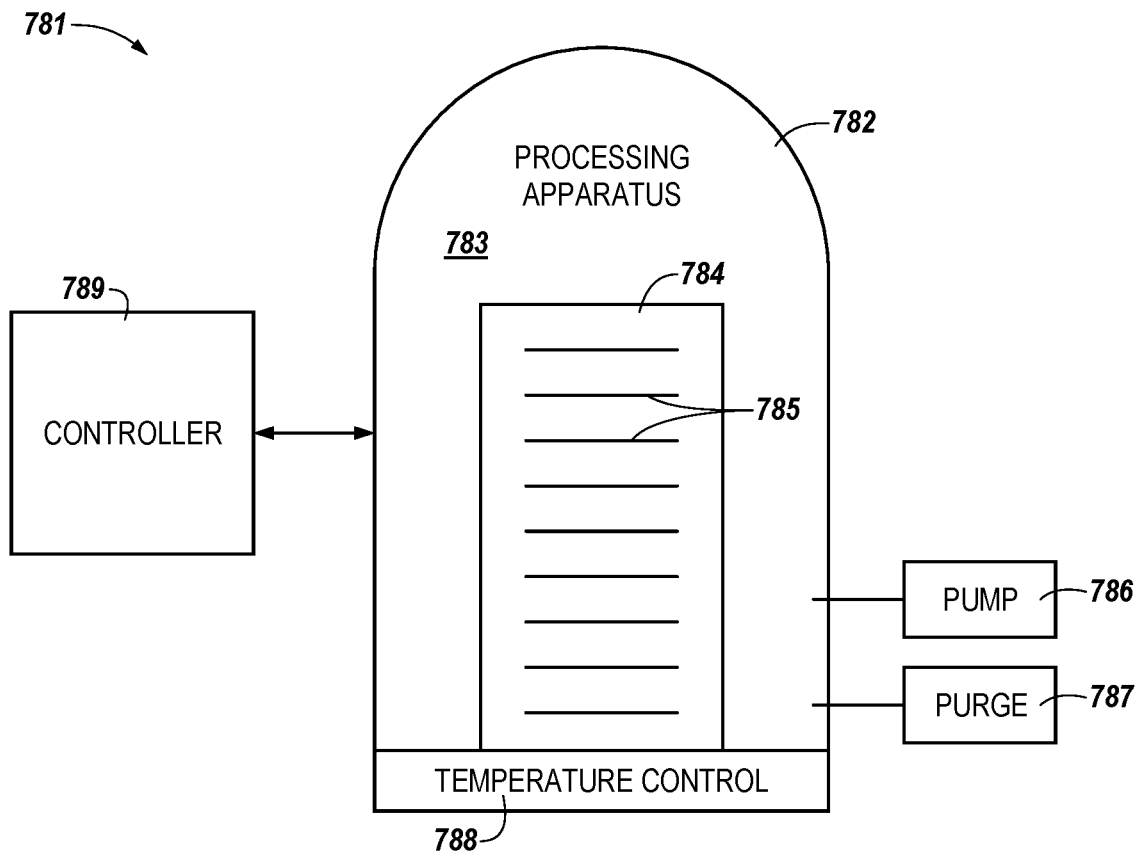
FIG. 7 is a functional block diagram of a system for implementation of an example semiconductor fabrication process in accordance with a number of embodiments of the present disclosure.

FIG. 7 is a functional block diagram of a system 781 for implementation of an example semiconductor fabrication process in accordance with a number of embodiments of the present disclosure. The system 781 may include a processing apparatus 782. The processing apparatus 782 may be configured to enable formation of structural materials on and/or removal of structural materials from a semiconductor device during fabrication of the semiconductor device.

The processing apparatus 782 may include a chamber 783 to enclose components configured to perform deposition or etch operations, in addition to deposition operations, on a number of semiconductor devices (e.g., wafers on which memory devices 568 and 670 or arrays 566 are being formed by the example semiconductor fabrication sequences described herein). The chamber 783 may further enclose a carrier 784 to hold a batch of semiconductor wafers 785. The processing apparatus 782 may include and/or be associated with tools including, for example, a pump 786 unit and a purge 787 unit configured to introduce and remove appropriate deposition chemistries and etch chemistries, or tools for performance of a damascene process (e.g., including CMP), as described herein, at each point in the semiconductor fabrication sequence. The processing apparatus 782 may further include a temperature control 788 unit configured to maintain the chamber 783 at an appropriate temperature at each of the points in the fabrication sequences. For example, the temperature control 788 unit may be configured to bring the chamber 783 to a temperature appropriate for annealing the noble metals described herein and to reduce the temperature as appropriate for performance of other portions of the anneal process (e.g., recrystallization of the conductive material) or of other processes (e.g., deposition, etching, etc.). The system 781 may include a number of chambers 783 that are each configured to perform particular processes (e.g., annealing, a wet etch process, a dry etch process, CMP, and/or a deposition process, among others) during the fabrication sequence.

The system 781 may further include a controller 789. The controller 789 may include, or be associated with, circuitry and/or programming for implementation of, for instance, annealing, deposition and removal of materials, including etching and/or CMP of various materials, related to reduction of crystal growth resulting from annealing a conductive material. Adjustment of such annealing, deposition, removal, and etching operations by the controller 789 may control the CDs of the semiconductor devices created in the processing apparatus 781.

A host may be configured to generate instructions related to reduction of crystal growth resulting from annealing a conductive material. An example of a host is shown at 561 in FIG. 5, although embodiments are not limited to being coupled to the memory system 563 shown in FIG. 5. The instructions may be sent via a host interface 562 to the controller 789 of the processing apparatus 781. The instructions may be based at least in part on scaled preferences (e.g., in numerically and/or structurally defined gradients) stored by the host 561, provided via input from another storage system (not shown), and/or provided via input from a user (e.g., a human operator), among other possibilities. The controller 789 may be configured to enable input of the instructions and scaled preferences to define the CDs of the fabrication of the semiconductor device to be implemented by the processing apparatus 781.

The scaled preferences may determine final structures (e.g., the CDs) of structural materials, conductive materials, stabilizing materials, insulating materials, passivation materials, semiconductor materials, substrate materials, mask materials, dielectric materials, capacitor materials, memory devices, and/or memory cells, among the various other structural features described herein. Particular CDs may be enabled by the particular scaled preferences that are input via the instructions. Receipt and implementation of the scaled preferences by the controller 789 may result in corresponding adjustment, by the processing apparatus 782, of a deposition time for various materials, adjustment of the temperature during the anneal process, adjustment of a coverage area, height, and/or volume of the various materials, adjustment of a trim direction and/or trim time performed on the various materials, and/or adjustment of CMP direction, etch direction, and/or CMP/etch time performed on the various materials, among implementation of other possible scaled preferences.

The controller 789 may, in a number of embodiments, be configured to use hardware as control circuitry. Such control circuitry may, for example, be an application specific integrated circuit (ASIC) with logic to control fabrication steps, via associated annealing, deposition, and etch processes, related to reduction of crystal growth resulting from annealing a conductive material, along with formation of the various materials on and removal of the various materials from the semiconductor device.

The controller 789 may be configured to receive the instructions and direct performance of operations, corresponding to the instructions, by the processing apparatus 782. The controller 789 may be configured to implement the instructions to control a quantity of the various materials that are formed on and removed from the semiconductor device.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. Moreover, the structural features illustrated in the accompanying drawings are intended to indicate relative positioning of the structural features in one or more embodiments and are not necessarily drawn to scale relative to other structural features in the drawings or otherwise.

It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically for access to and/or for movement (transmission) of instructions (e.g., control signals, address signals, etc.) and data, as appropriate to the context.

While example embodiments including various combinations and configurations of structural materials, conductive materials, stabilizing materials, insulating materials, passivation materials, semiconductor materials, substrate materials, mask materials, dielectric materials, capacitor materials, memory devices, and/or memory cells, among other materials and/or components related to reduction of crystal growth resulting from annealing a conductive material, have been illustrated and described herein, embodiments of the present disclosure are not limited to those combinations explicitly recited herein. Other combinations and configurations of the structural materials, conductive materials, stabilizing materials, insulating materials, passivation materials, semiconductor materials, substrate materials, mask materials, dielectric materials, capacitor materials, memory devices, and/or memory cells, among other materials and/or components related to reduction of crystal growth resulting from annealing a conductive material than those disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a substrate material that is a nitride of one or more refractory metals;
   an annealed conductive material formed over a surface of the substrate material, and selected to have an electrical resistance that is reduced as a result of annealing, wherein the annealed conductive material comprises a noble metal and wherein the noble metal is deposited to a thickness of around 2 to 50 nanometers on the substrate material; and
   a stabilizing material formed over a surface of a conductive material prior to annealing the conductive material, wherein the stabilizing material is formed as a thin film on the surface to a thickness of one (1.0) nanometer or less and wherein the stabilizing material is a nitride of one or more refractory metals and is selected to have properties that comprise:
      stabilization of the reduced electrical resistance of the conductive material; and
      reduction of a degree of freedom of crystal growth relative to the surface resulting from recrystallization of the conductive material during the annealing.

2. The apparatus of claim 1, wherein a property of the selected stabilizing material reduces a scattering of electrons to contribute to the stabilization of the reduced electrical resistance.

3. The apparatus of claim 1, wherein a property of the selected stabilizing material reduces production of phonons to contribute to the stabilization of the reduced electrical resistance.

4. The apparatus of claim 1, wherein the annealed conductive material is formed to a thickness in a range of from two (2.0) to fifty (50) nanometers.

5. The apparatus of claim 1, wherein the annealed conductive material is utilized as at least one of an access line, a sense line, and an electrode for a semiconductor memory device.

* * * * *